United States Patent [19]
Abramov

[11] Patent Number: 6,005,467
[45] Date of Patent: Dec. 21, 1999

[54] TRIMMABLE INDUCTOR

[75] Inventor: Igor Abramov, Del Mar, Calif.

[73] Assignee: Pulse Engineering, Inc., San Diego, Calif.

[21] Appl. No.: 08/799,075

[22] Filed: Feb. 11, 1997

[51] Int. Cl.$^6$ .............................. H01F 5/00; H01F 27/28
[52] U.S. Cl. ......................... 336/200; 336/232; 336/223
[58] Field of Search .................................. 336/200, 223, 336/225

[56] References Cited

U.S. PATENT DOCUMENTS

| | | | |
|---|---|---|---|
| 3,785,046 | 1/1974 | Jennings | 29/602 |
| 3,874,075 | 4/1975 | Lohse | 336/200 |
| 3,947,934 | 4/1976 | Olson | 29/25.42 |
| 4,253,231 | 3/1981 | Nouet | 336/200 |
| 4,758,808 | 7/1988 | Sasaki et al. | 336/185 |
| 5,239,289 | 8/1993 | Ferraiolo et al. | 336/180 |
| 5,572,180 | 11/1996 | Huang et al. | 336/200 |

FOREIGN PATENT DOCUMENTS

| | | | |
|---|---|---|---|
| 53-161568 | 7/1980 | Japan | 336/200 |
| 68073 | 7/1973 | Luxembourg . | |

OTHER PUBLICATIONS

Askin et al., Printed Inductor With shorting Bars Deletable by Laser for Adjusting the Value of Inductance, IBM Technical Disclossure Bulletin, vol. 28 No. 7, Dec. 1995.

Patent Abstracts of Japan, App. No. 53161568, Dec. 29, 1978 "Chip Type Inductor", Pub. Jul. 11, 1980, Pub. No. 55091804 Applicant: TDK Corp./Inventor: Takahashi Tetsuo.

Patent Abstracts of Japan, App. No. 60098279, May 8, 1985 "Production of Variable Chip–Type Inductor", Pub. Nov. 14, 1986, Pub. No. 61256611, Applicant; Fujitsu Ltd./Inventor: Mishiro Eiji.

Patent Abstract of Japan, App. No. 57032864, Mar. 1, 1982 "Chip Type High Frequency Coil," Pub. Sep. 03, 1983, Pub. No. 58148412, Applicant: Matsushita Electric Ind. Co. Ltd./ Inventor: Otani Yoshiaki.

*Primary Examiner*—Michael L. Gellner
*Assistant Examiner*—Anh Mai
*Attorney, Agent, or Firm*—Knobbe, Martens, Olson & Bear, LLP

[57] ABSTRACT

A trimmable inductor, comprises a supporting substrate (12) having spaced apart lead terminals, a coil (20) defined by an electrically conductive member mounted on the substrate in a continuous path of multiple turns forming a winding about an axis and extending between the lead terminals, and an electric conductive shorting member (30) extending and electrically connected between one or more turns (20) and (22) a terminal of the coil to enable selective inclusion and elimination of at least part of one of the turns of the coil.

15 Claims, 4 Drawing Sheets

TRIMMABLE INDUCTOR

BACKGROUND OF THE INVENTION

The present invention relates to miniature inductors and pertains particularly to improved trimmable inductors and methods of manufacture.

Miniature inductors are widely used in UHF and microwave radio frequency electronic circuits. The inductors are made in two basic configurations: wire wound and monolithic. Monolithic inductors typically employ thin conductive film in several configurations, some of which are the flat spiral type formed on a planar substrate and the helical type formed on an elongated substrate.

A spiral-type inductor usually consists of a flat ceramic substrate on which single layer flat spiral metal pattern is defined. Other examples include stacked turns in a multilayer construction; spirals situated on both sides of a thin substrate and spirals connected in series.

A helical-type monolithic inductor consists of an elongated ceramic or ferrite core on which is formed a conductive metal helical pattern. The substrate is covered with one or more metal layers which are then etched or cut to form a conductor in a helical fashion. Such a cut defines a helical conductive winding similar to a wire coil.

Often after an inductor is placed in a circuit, it does not perform precisely as expected due to influence of extraneous factors such as nearby components, construction of the printed circuit board, geometry of connections to the inductor, mounting technique, and the like. Also, sometimes the intended circuit operation is not achieved with the selected inductor value due to variation in values of other components in the circuit.

A common way to adjust component values in a circuit is to have adjustable components. While trim resistors and capacitors are common and available in reasonably small physical sizes, adjustable inductors tend to be quite large and therefore virtually incompatible with modern miniature electronic systems, such as portable cellular telephones and pagers, for example.

Adjustable components are more expensive than fixed-value components and their use often results in increased size, as well as costs, of the circuits. Adjustable components are also generally considered not as reliable as the fixed components.

The permanently in-circuit laser-trimmed components bridge the gap between adjustable and fixed-value components. However, heretofore the laser trimmable components were limited to resistors and capacitors only.

Some applications require the inductor to be of a certain precise value for the circuit to work. Customarily, for small surface mount inductors, if inductor of a given value does not perform satisfactorily, it is removed from the circuit by de-soldering and new inductors of different values are substituted instead, until satisfactory circuit performance is attained. Since commercial inductors generally come in standard values, there is a chance that the needed inductance will fall between the standard values available, resulting in sub-optimal performance of the circuit.

Additionally, in some applications, such as a Radio Frequency (RF) filter, it is advantageous to be able to change the Q-value of the circuit without major re-design or repeated layout and fabrication of the circuit.

Therefore, it is desirable that a miniature reliable and inexpensive trimmable inductor be available.

SUMMARY AND OBJECTS OF THE INVENTION

It is the primary object of the present invention to provide a reliable and economical trimmable miniature inductor.

In accordance with a primary aspect of the present invention, a trimmable inductor, comprises a supporting substrate having spaced apart lead terminals, a coil defined by an electrically conductive member mounted on said substrate in a continuous path of multiple turns forming a winding about an axis extending between said lead terminals, and an electric conductive shorting member extending and electrically connected between at least two adjacent windings of said coil to enable selective inclusion and elimination of one of said windings.

BRIEF DESCRIPTION OF THE PREFERRED EMBODIMENTS

The above and other objects and advantages of the present invention will become apparent from the following description when read in conjunction with the accompanying drawings wherein.

DETAILED DESCRIPTION OF THE PREFERRED EMBODIMENTS

Figure 1:
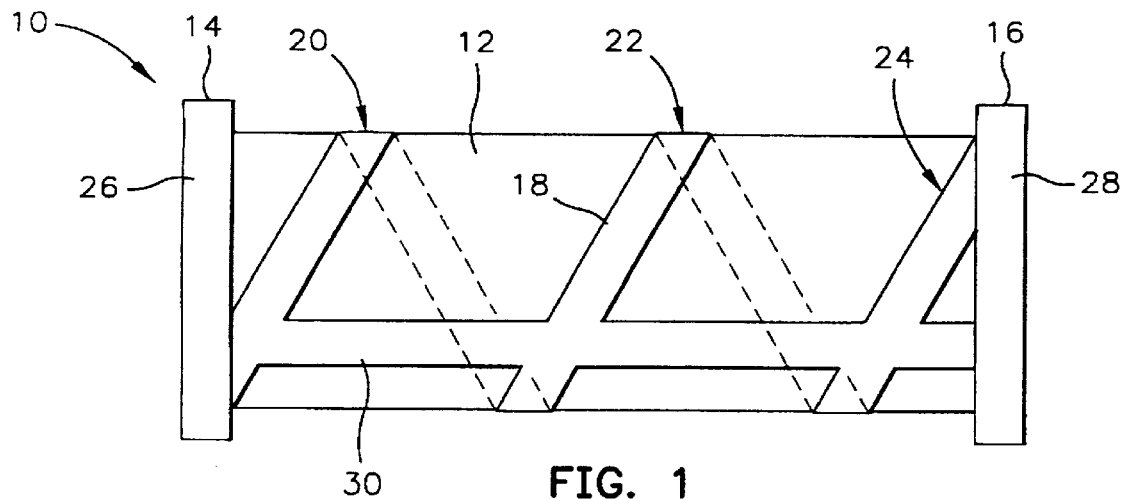
FIG. 1 is a top plan view of a trimmable inductor in accordance with a preferred embodiment of the invention.

Referring now to FIG. 1 of the drawings, there is illustrated a monolithic inductor 10 constructed in accordance with a preferred embodiment of the present invention. The inductor, as illustrated, comprises a substrate or core 12 of a suitable material which may be either ceramic of ferrite and having a suitable cross-sectional configuration with end caps 14 and 16 of a greater diameter than the core. The core may have any suitable cross-sectional configuration, such as circular, square or rectangular, and the end caps may have a similar or even different cross-sectional configuration. The end caps support the inductor above a PC board surface and carry conductive strips or terminals for connection to terminals on the PC board.

The inductor 10 is formed by placing a layer of conductive material on the substrate 12 and end caps 14 and 16 and laser cutting away undesired material to leave a helical or spiral-wound conductor member 18 forming a first coil or turn 20, a second coil or turn 22, and a third coil or turn 24 in the illustrated embodiment. The conductor member 18 extends between and is conductively connected to conductive bands 26 and 28 formed on the peripheral surfaces of the end caps 14 and 16 to provide terminals for connecting the inductor 10 to a PC board.

A shorting conductor 30 extends between a portion of the winding 20 and each of the adjacent windings and the terminal strip 28. Thus, the shorting conductor 30 is connected between all turns or windings of the inductor coil and one or both terminals. This arrangement enables a broad range of adjustment in the inductance of this coil.

Figure 2:
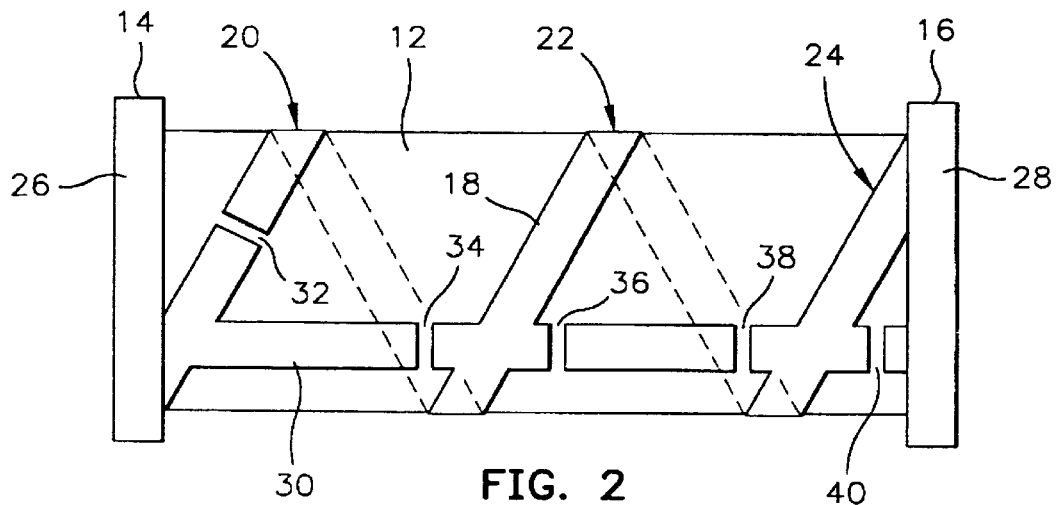
FIG. 2 is a view like FIG. 1 showing possible trim positions.

Any number of cuts of the conductors, either the turns or the portions thereof, or the shorting conductor can be used to selectively adjust the inductance of the inductor 10 to the desired values. For example, as illustrated in FIG. 2, a first cut may be made at 32 removing three-quarters of the turn 20 and simultaneously making cuts 36 and 40, thereby making an adjustment in the overall inductor. An alternative cut can be made at 34 instead of 32 and at either 36 or 38 and 40, to define or include all turns of the coil in the inductor. As can be seen, various cuts can be made in either the turns of the coil or the shorting conductor 30 to selectively determine the inductance of the inductor 10.

Figure 3:
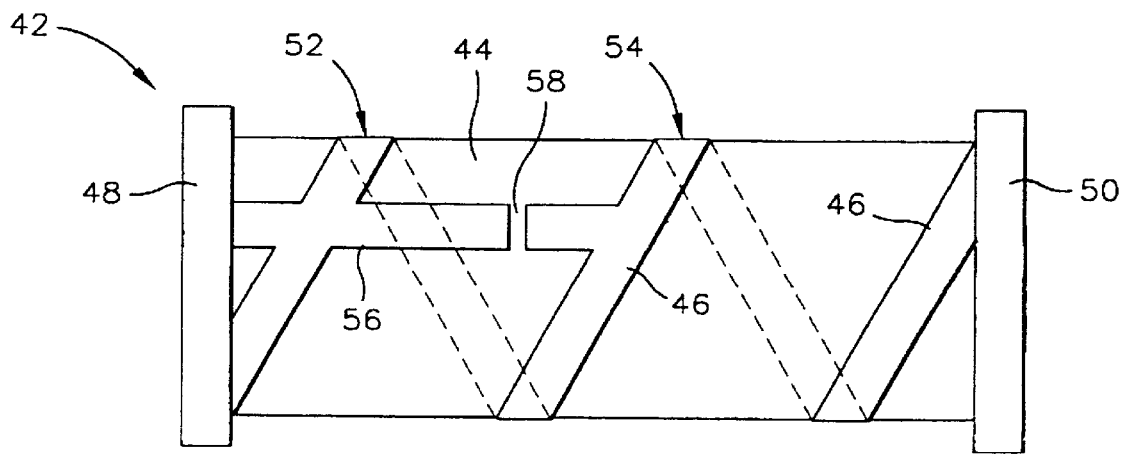
FIG. 3 is a view like FIG. 1 of an alternate embodiment.
Figure 4:
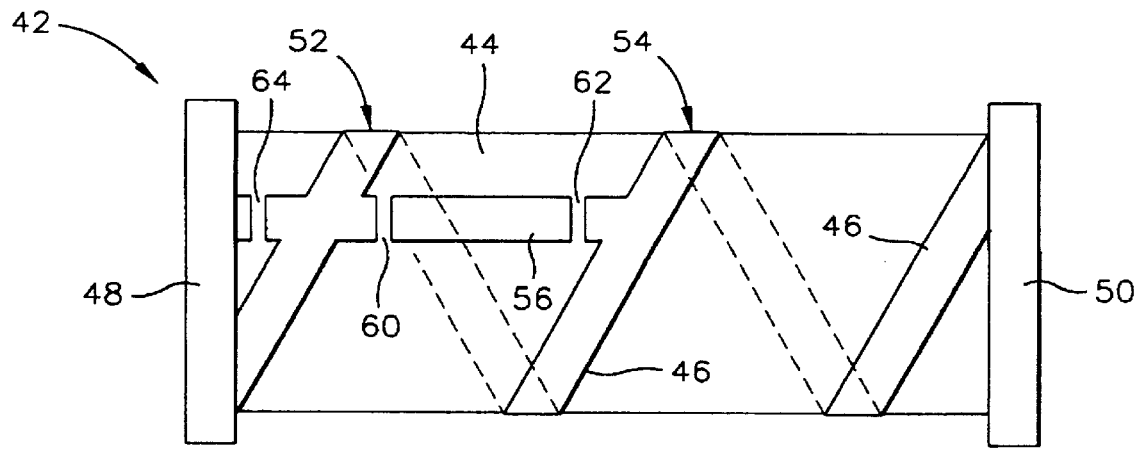
FIG. 4 is a view like FIG. 3 illustrating further trim positions.

Referring to FIGS. 3 and 4, a further embodiment is illustrated and designed generally by the numeral 42. It comprises a substrate 44 with a conductor 46 formed on the substrate and extending between and conductively connected to terminal bands 48 and 50 on the end caps of the substrate. The windings from a first turn 52 and a second turn 54 with an additional part turn extending to terminal band 50. A shorting conductor bar or strip 56 extends and is connected between the terminal 48 and a portion of turn 52 and turn 54. It does not extend completely across the substrate and all turns on the substrate as in the previous embodiment. With this arrangement, a number of cuts can still be made to trim the inductor. For example, as shown in FIG. 3, a cut can be made at 58 to include the first turn 52 to the inductor coil.

Referring to FIG. 4, alternatively cuts can be made at 60 and 62, and at 64 to remove the shorting conductor 52 entirely from the coil and thereby include both turns 52 and 54 of the coil.

Figure 5:
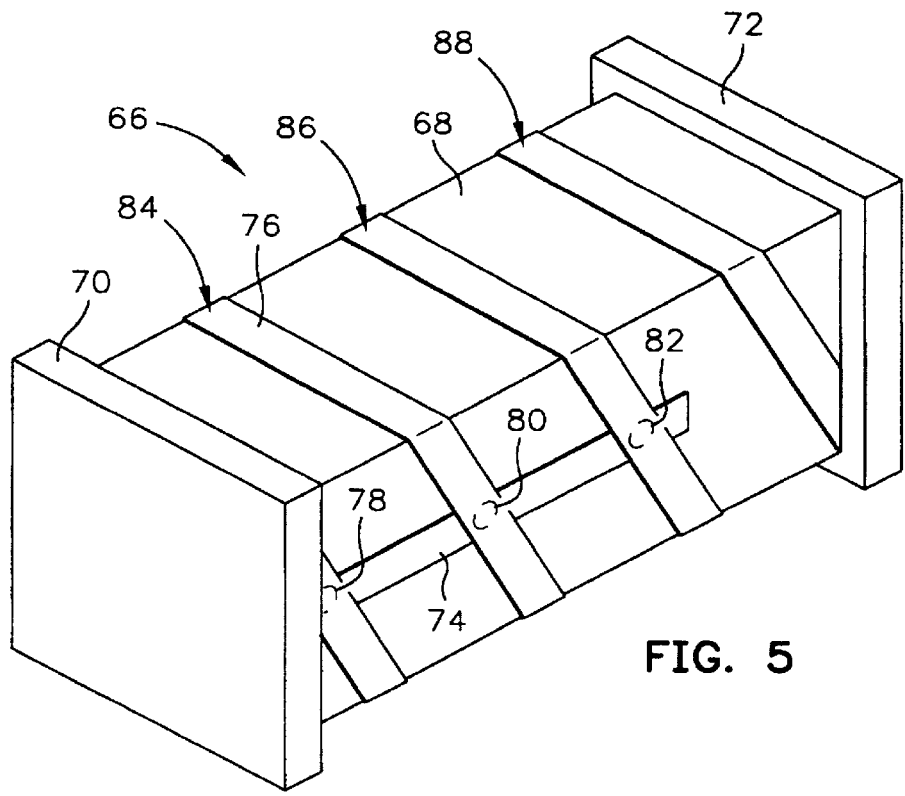
FIG. 5 is a perspective view illustrating a further embodiment.
Figure 6:
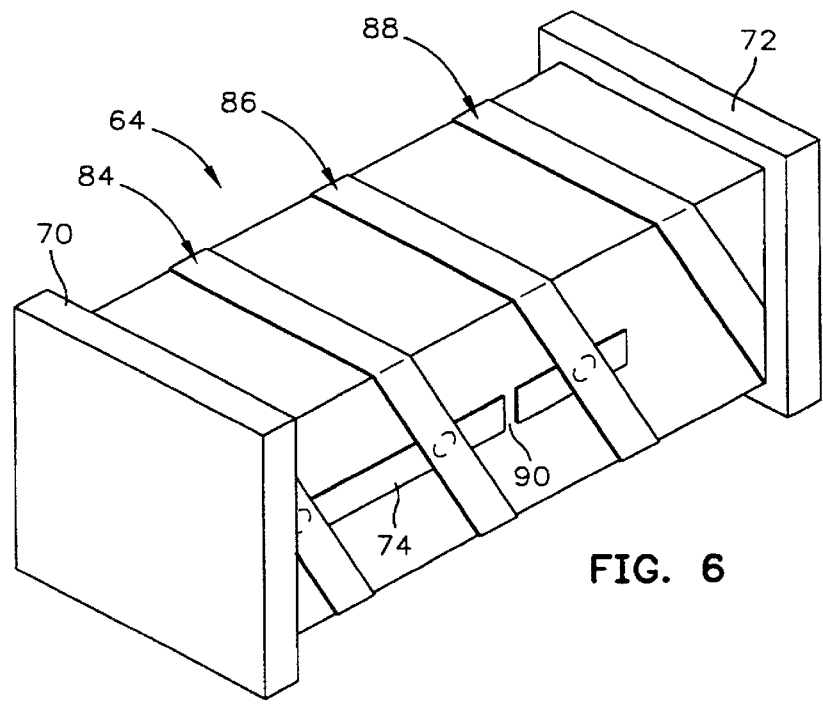
FIG. 6 is a view like FIG. 5, illustrating trim positions on the FIG. 5 embodiment.

Referring to FIGS. 5 and 6, a further embodiment is illustrated and designated generally by the numeral 66. It has a substrate 68 and 70 and 72, as in the prior embodiments. In this embodiment, terminal strips 70 and 72 and a shorting strip or conductor 74 are formed on the substrate as in prior embodiments. However, the winding is formed by a wire 76 connected at one end to the terminal band 70 and at the other end to terminal band 72. The wire is wrapped around the core substrate to form a spiral coil as in prior embodiments, and as can be seen, overlaps the shorting conductor member 74. The wire forming the various turns of the coil, as in the illustrated embodiment, overlaps the shorting conductor with two and a portion of turns of the coil and is conductively connected, such as by thermo-compression welding at sites 78, 80 and 82. However, as in the prior embodiments, the shorting strip can extend the full length of the inductor and be connected to each turn of the coil and to the terminal bands 70 and 72. The coil is formed with three turns 84, 86 and 88.

Referring to FIG. 6, the shorting conductor 74 is shown cut at 90, thereby including second coil or turn 86 in the inductor. Thus, as shown, the inductance increases as a result of the extra turn. As discussed, various arrangements may be made wherein various shorting strips may be positioned between selected turns of the coil in the inductor.

Figure 7:
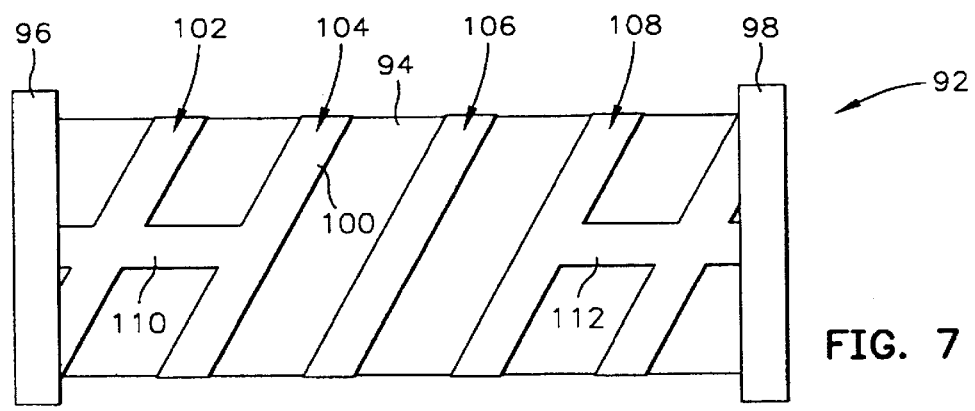
FIG. 7 is a top plan view illustrating a view like FIG. 5, illustrating another embodiment.

Referring to FIG. 7, an inductor is illustrated wherein the inductor designated generally by the numeral 92 comprises a substrate 94 having terminals 96 and 98 as in the prior embodiments. Conductive strips are formed as illustrated with a strip 100 forming a winding of multiple turns 102, 104, 106 and 108 of a generally helical coil. In this embodiment, two shorting conductor 110 and 112 extend from the respective terminals 96 and 98 inward to first and second turns 102 and 104 and for the turn 108 of the inductor. The shorting conductors connect to the terminals at a partial turn from the connection of the coil from the respective terminals. Thus, various cuts can be made in one or the other of the shorting conductors or selected turns to remove either a portion of a turn or a full turn from the inductor. The shorting conductor can be left in place to remove the respective turns from the coil or can be selectively cut to include all or a portion of the respective turns.

Figure 8:
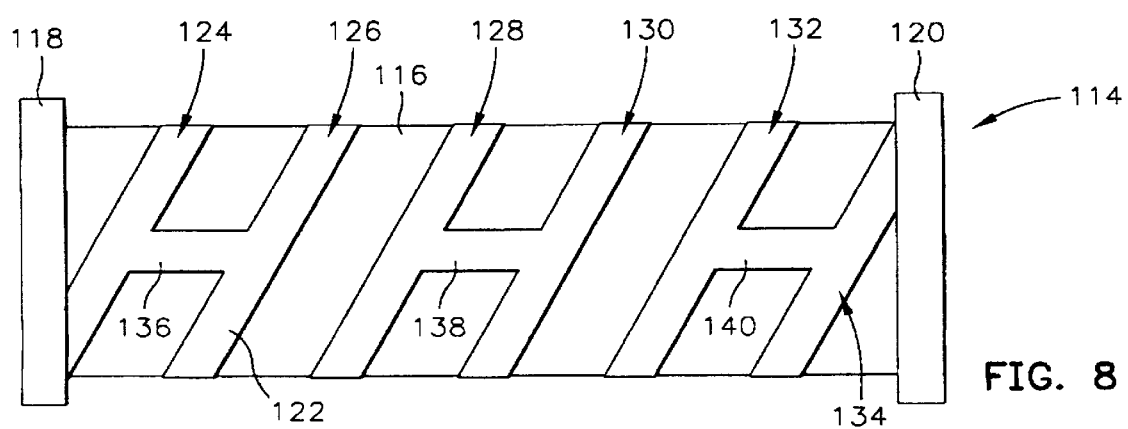
FIG. 8 is view like FIG. 7, illustrating a still further embodiment.

Referring now to FIG. 8, a still further embodiment is illustrated and designed by the numeral 114. It comprises a substrate 116 as in prior the embodiments, having terminals 118 and 120. The inductor is a monolithic inductor as in the prior embodiments with a coil conductor 122 extending around the substrate or core in a helical fashion between the respective terminals 118 and 120, 124 and 126, 128 and 130. The conductor 122 forms turns 124, 126, 128, 130 and 132 and a half turn 134. A plurality of shorting conductors 136, 138 and 140, are connected between selective adjacent turns 124 and 126, 128 and 130, and 132 and 134 of the coil. The shorting conductors can be left in place to thereby remove one turn for each conductor from the coil of the inductor. The inductor can be trimmed by cutting one or more of the shorting conductor strips to thereby include additional ones or all of the turns of the coil in the inductor. These various arrangements, as illustrated and as discussed above, provide a wide range of adjustability to inductors. While a helical-wound type has been illustrated and described, it is apparent that the principles can be applied to spiral-wound and other types of inductors.

Figure 9:
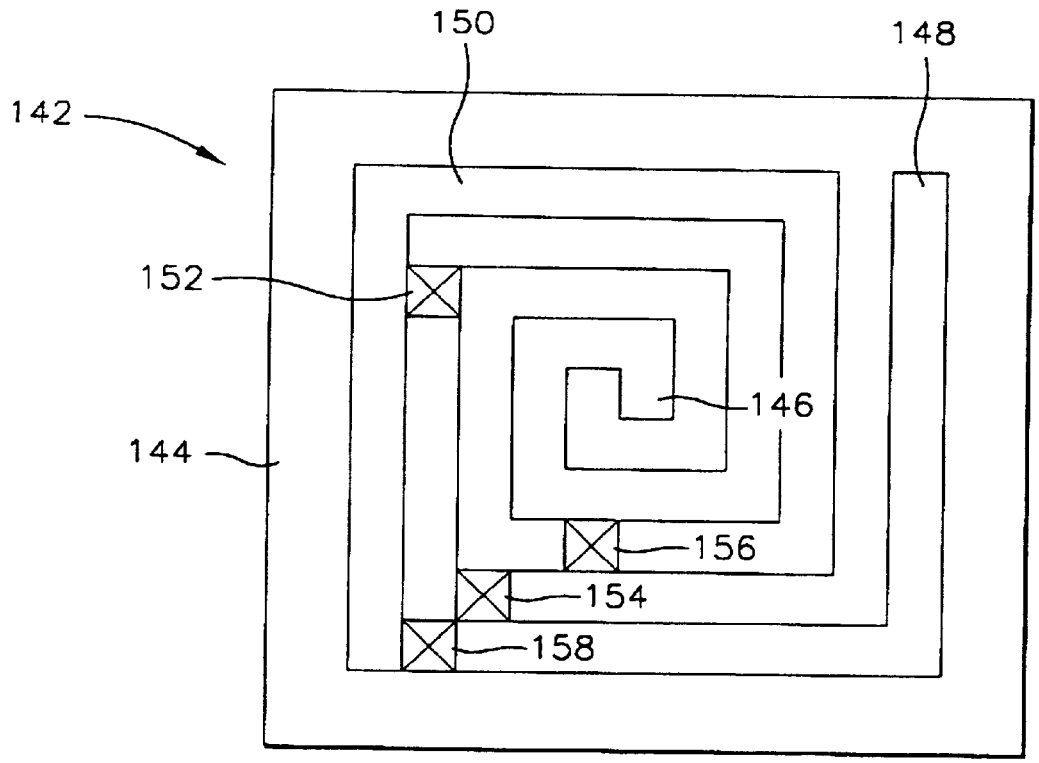
FIG. 9 is a top plan view of a trimmable spiral type inductor.
Figure 10:
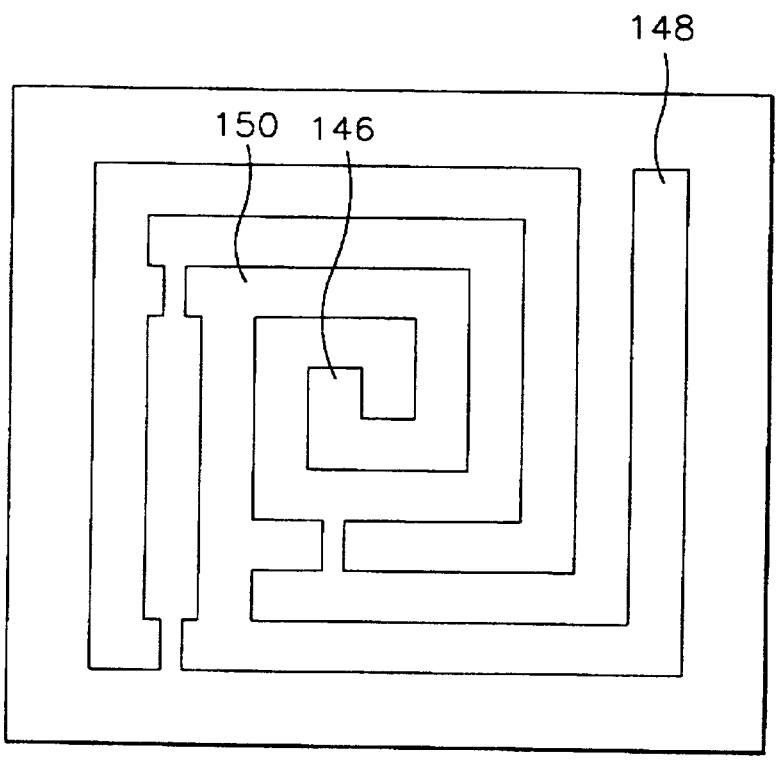
FIG. 10 is a view like FIG. 9 illustrating an exemplary trim.

Referring to FIGS. 9 and 10, a spiral-wound inductor is illustrated and designed generally by the numeral 142. In this embodiment a substrate 144 has a planar face on which is formed terminals 146 and 148. A spiral conductor 150 on the face of the substrate connects between the terminals 146 and 148. A series of shorting conductors 152 and 154 are connected between adjacent turns of the coil between the two terminals and provides trim sites. This construction also provides a number of additional trim sites 156 and 158, which together with the respective shorting conductors can be selectively cut to trim the inductor.

Referring to FIG. 9, the coil conductor has been cut at a site 152, 156 and at 158. Shorting conductor 152 has been cut and shorting conductor 154 left in place to make a connection. This effectively cuts one complete turn of the coil from the inductor, thus altering the parameters of the inductor. Other cuts can be made in the arrangement to provide different degrees of trim for the inductor.

While I have illustrated and described my invention by means of specific embodiments, it is to be understood that numerous changes and modifications may be made therein without departing from the spirit and scope of the invention, as defined in the appended claims.

I claim:

1. A trimmable inductor, comprising:
   an elongated supporting substrate having an axis, an outer peripheral surface, opposite ends and lead terminal on each of said opposite ends;
   a coil defined by an electrically conductive member mounted on said substrate in a continuous path of multiple turns forming a helical winding about said axis on said outer peripheral surface and extending between and connected to said lead terminals; and
   an electrical conductive shorting member extending and electrically connected between at least one of said lead terminals and an adjacent turn of said coil and said shorting member connected to said one lead terminal at a position spaced from the connection of said turn to said one lead terminal to enable selective inclusion and elimination of part of said turn.

2. An inductor according to claims 1 wherein said substrate is formed of dielectric material.

3. An inductor according to claim 1 wherein said substrate is formed of ferrite material.

4. An inductor according to claims 1 wherein said conductive shorting member is segmented and connects between multiple pairs of turns of said winding on said substrate.

5. An inductor according to claim 4 wherein said lead terminals are conductive strips partially encircling the ends of said substrate.

6. An inductor according to claim 5 wherein said conductive member is a wire wound on said substrate.

7. An inductor according to claims 1 wherein said conductive shorting member extends between multiple turns of said winding on said substrate.

8. An inductor according to claims 7 wherein said conductive shorting member extends between all turns of said winding on said substrate.

9. An inductor according to claim 1 wherein the connection of said conductive shorting member to said one lead terminal is spaced at least a half turn from said lead terminal.

10. An inductor according to claim 9 wherein at least a pair of turns of said winding are initially connected together by said conductive shorting member.

11. An inductor according to claim 1 wherein said conductive member is a wire wound on said substrate.

12. An inductor according to claim 1 wherein said shorting member is a conductive layer applied to said substrate and said wire connected by thermo-compression to said shorting member.

13. An adjustable inductance inductor, comprising:

an elongated supporting substrate having a longitudinal axis, an outer peripheral support surface, a pair of enlarged end caps and at least a pair of spaced apart lead terminals on said end caps;

a coil defined by an elongated electrically conductive member mounted on said outer peripheral support surface of said substrate in a continuous path of multiple turns forming a winding about said axis and connected between said lead terminals; and an electric conductive shorting member extending and electrically connected between at least one of said terminals and an adjacent turn of said coil said shorting member connected to said one lead terminal at a position spaced from the connection of said turn to said one lead terminal to enable selective inclusion and elimination of part of a turn of said coil.

14. An inductor according to claims 13 wherein said conductive shorting member is connected between multiple pairs of turns of said winding on said substrate.

15. An inductor according to claim 13 wherein:

said shorting member is a conductive layer applied to said substrate;

said conductive member is a wire wound on said substrate; and and said wire is connected by thermo-compression to said shorting member.

* * * * *